FREQUENCY SYNTHESISERS
Filed Jan. 5, 1968
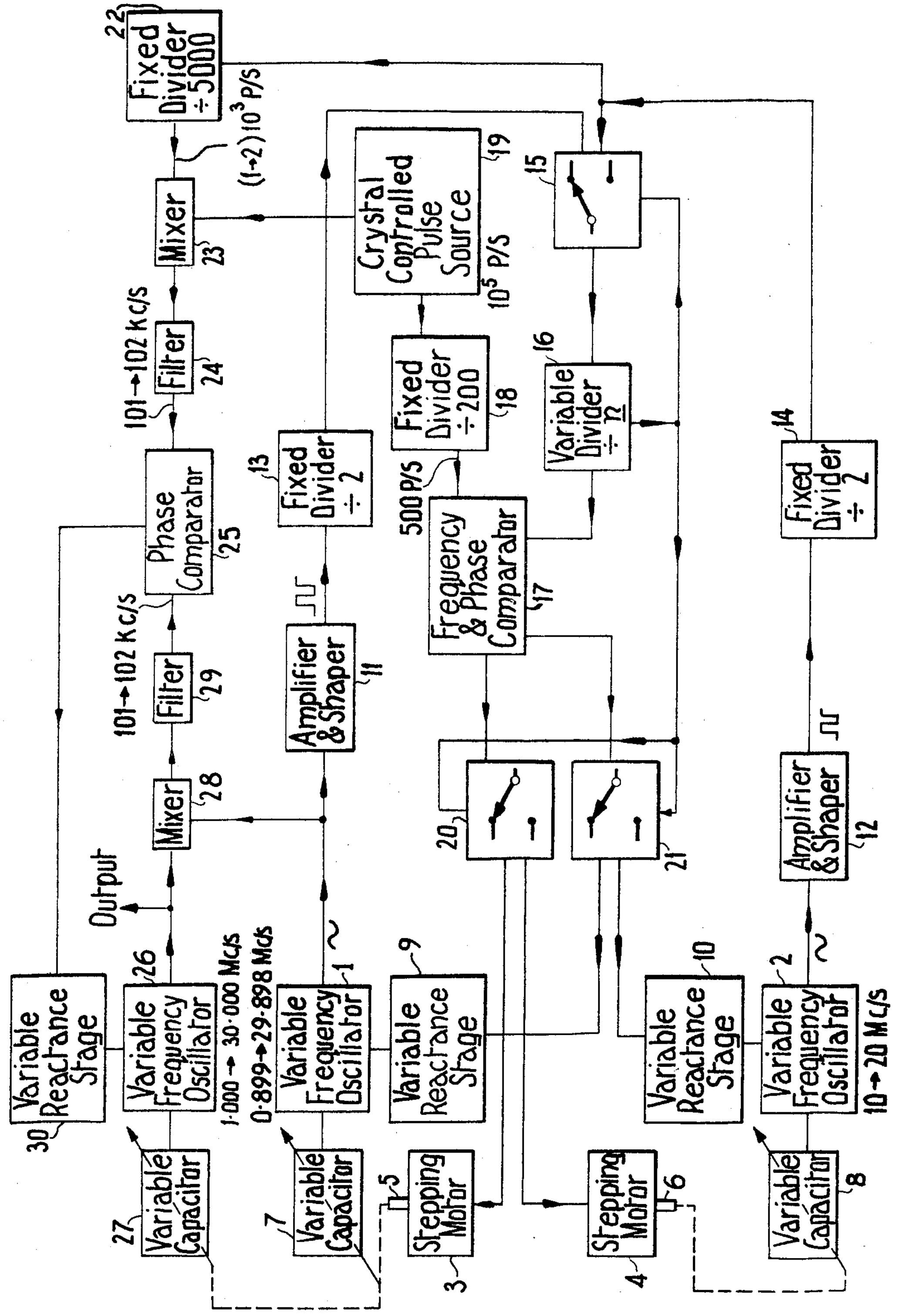

United States Patent Office 3,479,610
Patented Nov. 18, 1969

3,479,610

FREQUENCY SYNTHESISERS

Reginald Gordon Wicker, Coventry, England, assignor to The General Electric Company Limited, London, England, a British company Filed Jan. 5, 1968, Ser. No. 696,090
Claims priority, application Great Britain, Jan. 5, 1967, 695/67
Int. Cl. H03b 3/04
U.S. Cl. 331—2 10 Claims

ABSTRACT OF THE DISCLOSURE

A frequency synthesiser of the interpolation type wherein both the main and interpolation frequencies are derived from slave oscillators whose frequencies are controlled via control loops of the kind incorporating a variable factor divider whose output is compared in a comparator with a train of pulses of reference frequency. A single variable factor divider and comparator may be used in both control loops on a time sharing basis.

This invention relates to frequency synthesisers.

A known form of frequency synthesiser comprises a variable frequency oscillator whose frequency is controlled by the output of a comparator such that the frequency of a train of pulses applied to one input of the comparator and produced from the output of the oscillator by means of a variable factor divider is maintained substantially equal to the frequency of a train of pulses of predetermined stable frequency applied to another input of the comparator. With such an arrangement the frequency of the oscillator is locked at a frequency equal to the product of the setting of the variable divider and the stable predetermined frequency; thus the oscillator may be locked at any one of a plurality of equal spaced apart spot frequencies, the range of frequencies depending on the range of possible settings of the divider, and the spacing between the frequencies, i.e. the resolution of the synthesiser, being equal to the value of the predetermined stable frequency.

Using conventional techniques to increase the resolution of a frequency synthesiser of the kind specified over a given range of frequencies involves decreasing the magnitude of the stable frequency to a value equal to the required degree of resolution, and increasing the number and magnitude of the division factors at which the variable divider can operate by a corresponding factor. This technique introduces two difficulties. Firstly, since the frequencies of the input to, and hence the output from, the comparator are reduced, the short term stability of the variable frequency oscillator must be very good. Secondly, the range of division factors over which the variable factor divider is required to operate may impose requirements on the design of the variable factor divider which are virtually impossible to satisfy. For example, to obtain a resolution of 1 cycle per second over a range of 1 megacycle per second to 30 megacycles per second using conventional techniques, a variable divider whose division factor is variable in unitary steps over the range 1 million to 30 million, and which is capable of operating at a maximum counting speed of 30 million pulses per second is required.

It is an object of the present invention to provide a synthesiser which may have a high degree of resolution over a wide range of frequencies without involving the above-mentioned difficulties, but which retains the advantages of the above-mentioned known form of synthesiser.

According to the present invention a frequency synthesiser comprises: a first variable frequency oscillator whose frequency is controlled by the output of a comparator such that the frequency of a train of pulses applied to one input of the comparator and produced from the output of the oscillator by means of a variable factor frequency divider is maintained substantially equal to the frequency of a train of pulses of predetermined stable frequency applied to another input of the comparator; second variable frequency oscillator whose frequency is controlled by the output of a comparator such that the frequency of a train of pulses applied to one input of the comparator and produced from the output of the oscillator by means of a variable factor frequency divider is maintained substantially equal to the frequency of a train of pulses of predetermined stable frequency applied to another input of the comparator: means for deriving from the second oscillator a signal whose frequency is variable by means of the variable factor divider associated with the second oscillator in a plurality of steps over a range equal to the difference between two adjacent frequencies of the first oscillator obtainable by variation of the setting of the variable factor divider associated with the first oscillator; a third variable frequency oscillator from which the output of the synthesiser is derived; and a further comparator to one input of which is applied the output of said means for deriving a signal from the second oscillator and to the other input of which is applied a signal whose frequency is representative of the difference between the frequencies of said first and third oscillators, the output of the further comparator being utilised to control the frequency of the third oscillator so that the frequency of the inputs to the further comparator are maintained subsantially equal, and hence the frequency of the third oscillator is locked at a value differing from the frequency of the first oscillator by an amount equal to the frequency of the output of said means for deriving a signal from the second oscillator.

In a preferred arrangement in accordance with the invention a single variable factor divider is utilised by said first and second oscillators on a time sharing basis.

One arrangement in accordance with the invention will now be described, by way of example, with reference to the accompanying drawing which is a block schematic drawing of a frequency synthesiser providing an output whose frequency is variable in steps of 0.1 cycle per second over the range 1 megacycle per second to 30 megacycles per second.

Referring to the drawing, the arrangement includes first and second variable frequency LC oscillators 1 and 2 each of which is provided with a coarse frequency control means comprising a stepping motor 3 or 4 whose shaft 5 or 6 is coupled to a variable capacitor 7 or 8 incorporated in a frequency determining circuit of the relevant oscillator 1 or 2, and a fine frequency control means comprising a voltage controlled variable reactance stage 9 or 10 incorporated in the frequency determining circuit of the relevant oscillator 1 or 2.

The output of each LC oscillator 1 or 2 is fed to a separate amplifying and shaping circuit 11 or 12 which produces at its output a train of pulses having a repetition frequency equal to the oscillation frequency of the associated oscillator 1 or 2. The output of each amplifying and shaping circuit 11 or 12 is fed to a separate divide-by-two circuits 13 and 14 and the outputs of the divide-by-two circuits 13 and 14 are fed via a two-way electronic switch 15 to the input of a variable factor divider 16. The divider 16 is constituted by a cyclic decade counter which may be set to produce an output pulse in response to a selected number of input pulses, the counter being arranged to be automatically reset on production of an output pulse.

The output of the variable divider 16 is applied to one input of a frequency and phase comparator 17, and a train of pulses having a repetition frequency of 500 per second is applied to the other input of the comparator 17, this signal being derived by means of a fixed factor divider 18, of division factor 200, from a crystal controlled pulse source 19 which produces pulses at a repetition frequency of $10^5$ per second. The comparator 17 produces two outputs respectively representative of the frequency and phase differences between its two inputs, and these two outputs are respectively applied via two-way electronic switches 20 and 21 to the stepping motor 3 or 4 and reactance stage 10 or 11 associated with either the first or the second LC oscillator 1 or 2, according to the setting of the two-way switches 20 and 21.

The two-way switches 15, 20 and 21 are arranged to be operated by the reset mechanism of the variable divider 16 so that the divider 16 and the comparator 17 are connected with the first LC oscillator 1 during one set of alternate counting cycles of the divider 16, and are connected with the second LC oscillator 2 during the other set of alternate counting cycles of the divider 16. The divider 16 is arranged so that it may be set to divider by any number from 899 to 29,898 when it is connected with the first oscillator 1 and to divide by any number from 10,000 to 20,000 when it is connected to the second oscillator 2, the setting of the divider 16 changing automatically from one value to the other at the end of each counting cycle.

In operation, the outputs of the comparator 17 control the frequency and phase of each oscillator 1 or 2 so as to reduce the frequency and phase differences between the inputs to the comparator 17 to a minimum. Hence, the frequency of each oscillator 1 or 2 is stabilised at a value of $2 \times 500 \times n$ cycles per second, where $n$ represents the relevant setting of the divider 16. Thus, by means of the divider 16, the frequency of the oscillator 1 may be varied over the frequency range 0.899 mc./s. to 29.898 mc./s. in steps of 1 kc./s., and the frequency of the oscillator 2 may be varied over the range 10 mc./s. to 20 mc./s. in steps of 1 kc./s.

The output of the divide-by-two circuit 14 connected to the second oscillator 2 is fed to a fixed divider 22 of division factor 5000, so as to produce a pulse signal whose frequency varies with the frequency of the oscillator 2 over the range $10^3$ to $2 \times 10^3$ pulses per second in steps of 0.1 pulses per second.

This signal is mixed in a mixer 23 with a $10^5$ pulses per second signal derived from the crystal controlled source 19, and the upper side band of the resultant signal is selected by means of a filter 24. The resultant 101 kc./s. to 102 kc./s. signal, variable in steps of 0.1 c./s., is fed to one input of a phase comparator 25 whose purpose is explained below.

The synthesiser further includes a third variable frequency oscillator 26 which is provided with a coarse frequency control means comprising a variable capacitor 27 ganged with the variable capacitor 7 associated with the oscillator 1 so that its frequency is approximately 101 kc./s. above that of the oscillator 1. The frequency of the oscillator 26 is thus variable by variation of the setting of the variable factor divider 16 when connected with the oscillator 1 over a range of about 1 mc./s. to 30 mc./s. in steps of 1 kc./s.

The output of the oscillator 26 is mixed in a mixer 28 with the output of the oscillator 1 and the difference frequency signal, of approximate frequency 101 kc./s., is selected by a filter 29 and fed to the second input of the phase comparator 25. The output of the phase comparator 25 is applied to a voltage controlled reactance stage 30 associated with the oscillator 26 so as to control the frequency of the oscillator 26 in such a manner that the difference between the frequencies and phases of the inputs to the phase comparator 25 are reduced to a minimum. Hence, the frequency of the oscillator 26 is stabilised with respect to the crystal controlled source 19 at a value greater than the frequency of the oscillator 1 by an amount equal to the input of the phase comparator 25 which is derived from the oscillator 2. The frequency of the oscillator 26 may thus be varied, by variation of the setting of the variable divider 16 which controls the frequency of the oscillator 2, in steps of 0.1 cycle per second over a range of 101 kc./s. to 102 kc./s. above that of any frequency of the oscillator 1 selected by the other setting of the variable divider 16.

The frequency of the oscillator 26 is thus accurately controllable over the whole of the range of 1 mc./s. to 30 mc./s. with a resolution of 0.1 cycle per second by means of the variable factor divider 16, this oscillator 26 providing the output of the synthesiser.

I claim:

1. A frequency synthesiser comprising: a first variable frequency oscillator; a first signal comparator having first and second inputs and an output; a first variable factor frequency divider; means for applying to the input of the divider a signal whose frequency is dependent on the frequency of said oscillator; means for applying to the first input of the comparator a signal whose frequency is dependent on the frequency of the output of said divider; means for applying to the second input of the comparator a signal of predetermined stable frequency; means for utilising the signal appearing at the output of the comparator to control the frequency of said oscillator so that the frequency of the signal applied to the first input of the comparator is maintained substantially equal to the frequency of the signal applied to the second input of the comparator; a second variable frequency oscillator; a second signal comparator having first and second inputs and an output; a second variable factor frequency divider; means for applying to the input of said second divider a signal whose frequency is dependent on the frequency of said second oscillator; means for applying to the first input of said second comparator a signal whose frequency is dependent on the frequency of the output of said second divider; means for applying to the second input of said second comparator a signal of predetermined stable frequency; means for utilising the signal appearing at the output of said second comparator to control the frequency of said second oscillator so that the frequency of the signal applied to the first input of said second comparator is maintained substantially equal to the frequency of the signal applied to the second input of said second comparator; means for deriving from said second oscillator a signal whose frequency is variable by means of said second variable factor divider in a plurality of steps over a range equal to the difference between two adjacent frequencies of the first oscillator obtainable by variation of the setting of the first variable factor divider; a third variable frequency oscillator from which the output of the synthesiser is derived; a third signal comparator having first and second inputs and an output; means for applying to the first input of the third comparator the output of said means for deriving a signal from said second oscillator; means for applying to the second input of the third comparator a signal whose frequency is representative of the difference between the frequencies of said first and third oscillators; and means for utilising the signal appearing at the output of the third comparator to control the frequency of the third oscillator so that the frequency of the signal applied to the second input of the third comparator is maintained substantially equal to the frequency of the input applied to the first input of the third comparator, whereby the frequency of the third oscillator is locked at a value differing from the frequency of the first oscillator by an amount equal to the output of said means for deriving a signal from the second oscillator.

2. A synthesiser according to claim 1 wherein said first and second variable factor frequency dividers are constituted by one and the same divider whose input is alternately connected with said first and second oscillators on a time sharing basis.

3. A synthesiser according to claim 2 wherein the variable factor divider comprises a cyclic counter which may be set to provide an output pulse in response to any selected number of input pulses within a predetermined range, and the first and second oscillators are connected to the input of the variable divider via an electronic switch the setting of the divider changing automatically from one to the other of two selected numbers in said range at the end of each counting cycle, and the electronic switch being operated with the re-set mechanism of the variable divider so that the divider is connected with the first oscillator during one set of alternate counting cycles of the variable divider and is connected with the second oscillator during the other set of alternate counting cycles of the variable divider.

4. A synthesiser according to claim 2 wherein said first and second signal comparators are constituted by one and the same comparator whose output is alternately connected with said first and second oscillators on a time sharing basis.

5. A synthesiser according to claim 3 wherein said first and second comparators are constituted by one and the same comparator whose output is alternately connected to said first and second oscillators via an electronic switch which is operated with the re-set mechanism of the variable factor divider.

6. A synthesiser according to claim 1 wherein the first and second oscillators each include a frequency determining circuit including a coarse frequency control means and a fine frequency control means, each said coarse frequency control means being controlled by an output signal derived from the associated signal comparator which is representative of the frequency difference between the inputs to that comparator, and each said fine frequency control means being controlled by an output signal derived from the associated signal comparator which is representative of the phase difference between the inputs to that comparator.

7. A synthesiser according to claim 1 wherein said means for deriving a signal from said second oscillator incorporates a mixer circuit to one input of which is applied a signal derived from the second oscillator via a further frequency divider and to the other input of which is applied a signal of stable frequency.

8. A synthesiser according to claim 7 wherein said signal of stable frequency applied to said mixer and said signals of predetermined stable frequency applied to said first and second signal comparators are derived from the same source.

9. A synthesiser according to claim 1 wherein said third oscillator incorporates a frequency determining circuit including a coarse frequency control means and a fine frequency control means, said coarse frequency control means being ganged with a frequency control means incorporated in a frequency determining circuit of said first oscillator so that the frequency of the third oscillator is maintained at a value differing from the frequency of the first oscillator by an amount approximately equal to the frequency of the output of said means for deriving a signal from the second oscillator; and said fine frequency control means being controlled by the signal derived from the output of said third signal comparator.

10. A synthesiser according to claim 9 wherein said third comparator is a phase comparator.

References Cited

UNITED STATES PATENTS 3,319,178 5/1967 Broadhead ------------- 331—2

JOHN KOMINSKI, Primary Examiner

U.S. Cl. X.R.

331—10, 14, 31